US008841763B2

(12) United States Patent
Oganesian et al.

(10) Patent No.: US 8,841,763 B2
(45) Date of Patent: Sep. 23, 2014

(54) THREE-DIMENSIONAL SYSTEM-IN-A-PACKAGE

(75) Inventors: Vage Oganesian, Sunnyvale, CA (US); Belgacem Haba, Saratoga, CA (US); Ilyas Mohammed, Santa Clara, CA (US); Piyush Savalia, Santa Clara, CA (US); Craig Mitchell, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 13/097,943

(22) Filed: Apr. 29, 2011

(65) Prior Publication Data
US 2012/0273933 A1 Nov. 1, 2012

(51) Int. Cl.
*H01L 23/12* (2006.01)
*H01L 23/00* (2006.01)
*H01L 23/538* (2006.01)

(52) U.S. Cl.
CPC ......... *H01L 24/82* (2013.01); *H01L 2924/1436* (2013.01); *H01L 2924/1433* (2013.01); *H01L 24/24* (2013.01); *H01L 2924/1434* (2013.01); *H01L 2924/01033* (2013.01); *H01L 2224/24145* (2013.01); *H01L 2924/01023* (2013.01); *H01L 23/5389* (2013.01); *H01L 2924/014* (2013.01); *H01L 2224/32225* (2013.01); *H01L 2224/32145* (2013.01); *H01L 2924/14* (2013.01); *H01L 2224/73267* (2013.01); *H01L 2924/01087* (2013.01); *H01L 2924/01005* (2013.01); *H01L 2924/1437* (2013.01); *H01L 2924/01006* (2013.01); *H01L 24/97* (2013.01)
USPC ............................ 257/700; 257/783; 438/118

(58) Field of Classification Search
CPC .. H01L 23/528; H01L 23/538; H01L 23/5389
USPC ........... 257/686, 700, 774, 777, 783; 438/118
See application file for complete search history.

(56) References Cited

U.S. PATENT DOCUMENTS

| 5,353,498 | A | * | 10/1994 | Fillion et al. | 29/840 |
| 6,137,164 | A | * | 10/2000 | Yew et al. | 257/686 |
| 6,350,632 | B1 | * | 2/2002 | Lin | 438/107 |
| 6,414,847 | B1 | * | 7/2002 | Hutchison et al. | 361/704 |
| 6,603,209 | B1 | * | 8/2003 | DiStefano et al. | 257/781 |
| 2002/0137253 | A1 | * | 9/2002 | Guida | 438/106 |
| 2004/0128101 | A1 | * | 7/2004 | Hermerding, II | 702/136 |
| 2007/0158810 | A1 | * | 7/2007 | Song et al. | 257/686 |
| 2008/0142990 | A1 | * | 6/2008 | Yu et al. | 257/777 |
| 2010/0213603 | A1 | * | 8/2010 | Smeys et al. | 257/698 |
| 2010/0224992 | A1 | * | 9/2010 | McConnelee et al. | 257/723 |

OTHER PUBLICATIONS

Hu, Jie and Min-Feng Yu. "Meniscus-Confined Three-Dimensional Electrodeposition for Direct Writing of Wire Bonds." Science 329, 313 (2010).*

* cited by examiner

*Primary Examiner* — Thao X Le
*Assistant Examiner* — Laura Dykes
(74) *Attorney, Agent, or Firm* — Lerner, David, Littenberg, Krumholz & Mentlik, LLP

(57) ABSTRACT

A microelectronic assembly can include first, second and third stacked substantially planar elements, e.g., of dielectric or semiconductor material, and which may have a CTE of less than 10 ppm/° C. The assembly may be a microelectronic package and may incorporate active semiconductor devices in one, two or more of the first, second or third elements to function cooperatively as a system-in-a-package. In one example, an electrically conductive element having at least a portion having a thickness less than 10 microns, may be formed by plating, and may electrically connect two or more of the first, second or third elements. The conductive element may entirely underlie a surface of another one of the substantially planar elements.

5 Claims, 9 Drawing Sheets

THREE-DIMENSIONAL SYSTEM-IN-A-PACKAGE

BACKGROUND OF THE INVENTION

For various reasons, it can be desirable to provide microelectronic assemblies which include a plurality of microelectronic elements, e.g., semiconductor chips in the same microelectronic assembly such as a microelectronic package. The microelectronic assembly can then be electrically and mechanically connected with contacts of a circuit panel, such as through solder balls or other mounting means at an external surface thereof. Such microelectronic assemblies can include a dielectric element with contacts thereon.

Some microelectronic assemblies incorporate microelectronic elements of different kinds, such as some microelectronic elements which primarily contain logic circuitry and other elements which primarily contain memory arrays, for example. Often, such microelectronic elements have different sizes, i.e., where the major surfaces of at least some of the microelectronic elements have different dimensions.

Further improvements can be made in view of the existing technology.

SUMMARY OF THE INVENTION

According to an aspect of the invention, a microelectronic assembly can include first, second and third substantially planar elements, which can consist essentially of dielectric or semiconductor material, for example, and which may have a coefficient of thermal expansion ("CTE") of less than 10 parts per million per degree Celsius ("ppm/° C."). The first element may have a dielectric layer at a first surface thereof and a plurality of electrically conductive elements exposed at the first surface. A second element may at least partly overlie the first element, the second element having a first surface facing away from the first element and a dielectric layer at such first surface. The second element may have a plurality of electrically conductive elements exposed at the first surface of the second element. A third element of the microelectronic assembly can have a plurality of electrically conductive elements exposed at a first surface thereof, the third element having a second surface facing toward the first and second elements. At least one of the first, second or third elements may embody a plurality of active circuit elements.

A second electrically conductive element may entirely underlie the second surface of the third element. The second electrically conductive element may have a thickness of less than 10 microns, and may contact and electrically connect respective electrically conductive elements exposed at the first surfaces of the first and second elements. In a particular example, the second electrically conductive element can be formed by plating a metal layer onto a surface of a dielectric layer overlying the first element, the second element, or both, and in openings in the dielectric layer.

In accordance with an aspect of the invention, a microelectronic assembly may include first and second substantially planar elements, each having a first surface and an edge surface extending away from the respective first surface, and each of the first and second elements having a dielectric layer exposed at the first surface and a plurality of conductive elements exposed at the first surface. At least one of the first or second elements can be a microelectronic element embodying a plurality of active circuit elements. The second element may at least partly overlie the first surface of the first element, and the first surface of the second element may face away from the first element.

A monolithic dielectric region can overlie the first surface and at least one edge surface of at least one of the first and second elements. At least one of the conductive elements may be exposed within an opening of the monolithic dielectric region. At least one second electrically conductive element may overlie and extend along a surface of the monolithic dielectric region remote from the first edge surface and along the at least one edge surface of the at least one first or second element. The second conductive element may extend from the at least one conductive element to a location beyond the at least one edge surface. In a particular example, a third substantially planar element may at least partly overlie the first surface of the second element.

A system according to an aspect of the invention may include a structure, e.g., a microelectronic assembly such as described above, and one or more other electronic components electrically connected to the structure. The system may further include a housing, and the structure and other electronic components may be mounted to the housing.

In accordance with an aspect of the invention, a method is provided of making a dielectric assembly. Such method can include: forming openings in a dielectric region overlying a first surface of a first element, electrically conductive elements of the first element being exposed within the openings. The method can further include: then depositing a metal onto the dielectric region and into the openings to form second electrically conductive elements contacting the conductive elements and the dielectric region. The method can further include: stacking at least one second element at least partly overlying the first surface of the first element with a bonding layer between the first and second elements, the second element having a first surface facing away from the first element and electrically conductive elements exposed thereat; and forming second openings in a second dielectric region overlying a first surface of the second element, electrically conductive elements of the second element being exposed within the second openings. The method can further include depositing a metal onto a surface of the second dielectric region and into the second openings to form third electrically conductive elements contacting the conductive elements of the second element and the second dielectric region, at least one of the third conductive elements directly contacting at least one of the second conductive elements at a location above the first surface of the first element; and may include: stacking at least one third element at least partly overlying the first surface of the second element with a second bonding layer between the second and third elements, the third element fully overlying at least one second and at least one third conductive element. The first, second and third elements can be substantially planar and at least one of the first, second and third elements can be a microelectronic element having a plurality of active circuit elements.

In accordance with another aspect of the invention, a method is provided of making a dielectric assembly, which can include: forming a monolithic dielectric region overlying a first surface of a second element and an edge surface extending away from the second element, the second element at least partly overlying a first element; and forming an electrically conductive element extending along a surface of the dielectric region and through an opening in the dielectric region to a contact exposed at the first surface of the second element, the electrically conductive element extending beyond the edge surface of the second element. At least one of the first or second elements may be a microelectronic element embodying active circuit elements.

In accordance with another aspect of the invention, a method is provided of making a dielectric assembly. The method can include: forming a dielectric region overlying a first surface of a second element and overlying an edge surface extending away from the second element, the second element at least partly overlying a first element; forming an electrically conductive element extending along a surface of the dielectric region and through an opening in the dielectric region to a contact exposed at the first surface of the second element, the conductive element extending beyond the edge surface of the second element and being electrically connected to the first element; and mounting a third element at least partly overlying the first and second elements and overlying the electrically conductive element, the third element having contacts electrically connected to at least one of the first or second elements. At least one of the first, second or third elements can be a microelectronic element embodying active circuit elements.

In accordance with another aspect of the invention, a method is provided of making a dielectric assembly, which can include: forming openings in a dielectric region overlying a first surface of a substantially planar first element, at least some electrically conductive elements of the first element being exposed within the openings; depositing a metal onto a surface of the dielectric region and within the openings to form second electrically conductive elements extending from the at least some first conductive elements onto the surface of the dielectric region; stacking at least one substantially planar second element at least partly overlying the first surface of the first element with a bonding layer between the first and second elements, the second element having a first surface facing away from the first element and first electrically conductive elements exposed thereat; forming second openings in a second dielectric region overlying the first surface of the second element, at least some of the conductive elements of the second element being exposed within the second openings; depositing a metal onto a surface of the second dielectric region and within the second openings to form third electrically conductive elements extending from the at least some first conductive elements of the second element, at least one of the third conductive elements directly contacting at least one of the second conductive elements at a location above the first surface of the first element; and stacking at least one substantially planar third element at least partly overlying the first surface of the second element with a second bonding layer between the second and third elements, the third element fully overlying the at least one second and third conductive elements. At least one of the first, second and third elements may be a microelectronic element having a plurality of active circuit elements, and the first, second and third elements are bonded together using the first and second bonding layers.

DETAILED DESCRIPTION

Figure 1A:
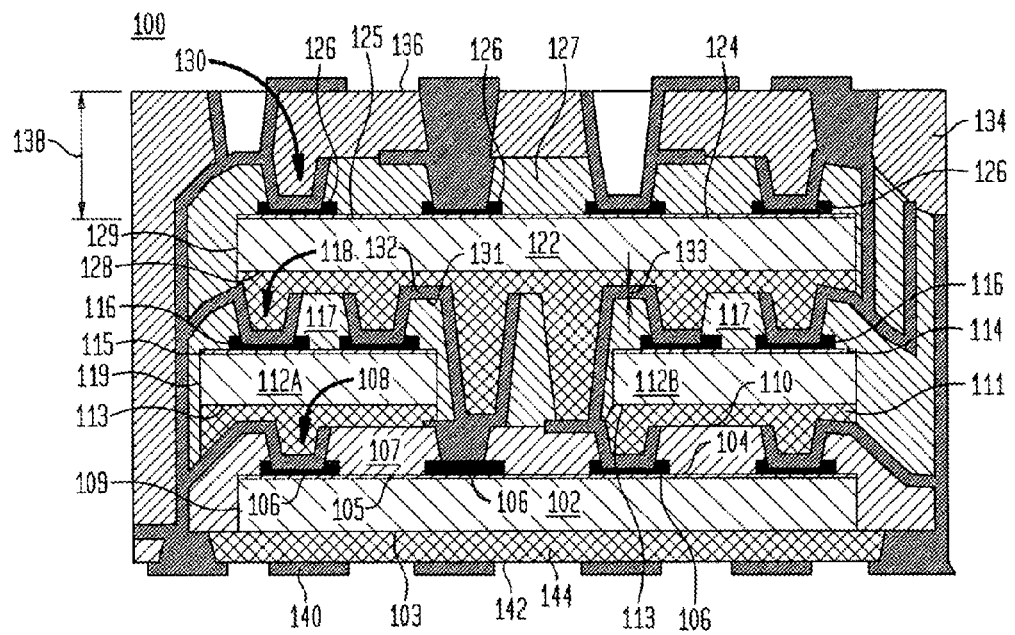
FIG. 1A is a sectional view depicting a microelectronic assembly in accordance with an embodiment herein.

The incorporation of microelectronic elements of different types or sizes in a package poses a particular challenge because the edges of the microelectronic elements may not be aligned. Moreover, the patterns of contacts, e.g., conductive pads, etc. on the microelectronic elements can vary.

A microelectronic assembly as further described herein may be a microelectronic package and may incorporate active semiconductor devices in one, two or more of the first, second or third elements to permit cooperative function therein as a system-in-a-package. In an embodiment of the invention, a microelectronic assembly is provided in which an electrically conductive element entirely underlying a substantially planar element (e.g., a dielectric element with contacts thereon, or a microelectronic element such as a semiconductor chip) can electrically connect lower substantially planar elements over which such substantially planar element at least partly lies. Typically, the electrically conductive element is formed by plating a metal element within openings in a dielectric layer that overlies the substantially planar elements and on a surface of the dielectric layer to electrically connect the substantially planar elements. Subsequently, one or more additional substantially planar elements can be placed over the lower substantially planar elements, after which similar processing may be performed for the additional elements. FIG. 1 illustrates a microelectronic assembly 100 in accordance with an embodiment of the invention. As seen therein, the microelectronic assembly includes a plurality of substantially planar elements, e.g., first element 102, second elements 112A, 112B and third element 122. Typically, each of the substantially planar elements is flat, rectangular, and thin in relation to the surface dimensions. For example, one or more of the substantially planar elements can be a microelectronic element such as a semiconductor chip embodying active circuit devices, e.g., transistors, among others. Semiconductor chips are flat thin bodies with surfaces typically having dimensions of a few to a few tens of millimeters on each side, and thicknesses typically under one millimeter. In certain examples provided herein, the microelectronic elements have thicknesses of up to 150 microns. Each of the substantially planar elements has a respective first surface 104, 114, 124, with a dielectric layer 105, 115, 125 exposed at such first surface and a plurality of electrically conductive elements 106, 116, 126, respectively, exposed at such first surface. As used in this disclosure, a terminal "exposed at" a surface of a dielectric element may be flush with such surface; recessed relative to such surface; or protruding from such surface, so long as the terminal is accessible for contact by a theoretical point moving towards the surface in a direction perpendicular to the surface.

As seen in FIG. 1, one or more of the second elements 112A, 112B may at least partly overlies the first surface 106 of the first element 102, and the third element 122 may at least partly overlies the first surfaces 116 of the second elements. The first surfaces of the second elements may face away from the first element. The first surface 124 of the third element may face away from the first and second elements, such that a second surface 128 of the third element opposite such first surface 124 faces toward the first and second elements.

In a particular example, one or more of the substantially planar elements can be a substrate such as a dielectric element in which the dielectric layer 105, 115 or 125 thereof alternatively extends throughout a thickness of such element. In certain examples provided herein, the substrates have thicknesses of up to 150 microns. It is also possible for at least one of the substantially planar elements to be a passive element, which in one example may be an "integrated passives on chip" ("IPOC") element which can include a layer of semiconductor or dielectric material or both, and can embody a plurality of passive devices. In a particular example, without limitation, one or all of the substantially planar elements can consist essentially of or include at least a layer of a material, e.g., a semiconductor or dielectric material, having a coefficient of thermal expansion of less than 10 parts per million/° C. (hereinafter "ppm/° C.").

Any or all of the first, second and third elements can be electrically connected to one another or to terminals exposed at an exterior of the microelectronic assembly. Electrical interconnection can be provided, for example, by electrically conductive elements which extend within openings in one or more dielectric regions overlying the first surfaces of the first, second or third elements. For example, as seen in FIG. 1, a first dielectric region 107 can overlie and be in contact with a first surface 104 of first element, having openings 108 therein through which conductive elements 106, e.g., pads, traces or contacts such as conductive pads, of the first element are exposed. The thickness of the dielectric region 107 typically is 5 to 30 microns. Similarly, a second dielectric region 117 can overlie and be in contact with a first surface 114 of a second element 112A, having openings 118 therein through which conductive elements 116 such as traces or contacts, e.g., conductive pads of the second element 112A are exposed. The second dielectric region 117 may also overlie and be in contact with the first surface 114 of second element 112B, and have openings 118 through which similar conductive elements 116 of that second element 112B are exposed. Similarly, a third dielectric region 127 can overlie and be in contact with a first surface 124 of a third element 122, having openings 130 therein through which conductive elements 126 such as traces or contacts, e.g., conductive pads of the third element 122 are exposed. In a particular example, the second elements can be a plurality of elements which are spaced apart from each other in a lateral direction which is parallel to the first surfaces of the second elements. The thicknesses of each dielectric region 107, 117, 127 can be about the same or comparable, e.g., 5 to 30 microns, or may be different.

As further seen in FIG. 1, the substantially planar elements typically have edge surfaces 109, 119, 129 extending away from their first surfaces 104, 114, 124. In one embodiment, the dielectric regions 107, 117, 127 which overlie the first, second or third elements, respectively, can be continuous monolithic dielectric regions. Such monolithic dielectric regions can also overlie and be in contact with the edge surfaces 109, 119, 129 of the first, second and third elements, respectively. In one example, the monolithic dielectric regions can consist essentially of a material such as polymeric dielectric material which is deposited in liquid form or laminated onto the first and edge surfaces of the corresponding first, second or third elements.

The edge surfaces 109, 119, 129 of the first, second and third elements may or may not be aligned in a vertical plane of the microelectronic assembly, "vertical" being a direction transverse to directions parallel to the first surface 104 of the first element. In a particular example as shown in FIG. 1A, an edge surface 119 of one or more of the elements, for example, second element 112A, can be disposed beyond an edge surface of another element, such as edge surfaces 109, 120 of the first and third elements 102, 122.

A bonding layer 111, such as an adhesive or other material forming a sufficiently strong bond, for example, can be disposed between the dielectric region overlying a particular element, e.g., the first element 102, and the next higher element, e.g., the second element 112A, or the third element 122 above such element. Typically, the bonding layer is a dielectric material and is applied to one or both surfaces to be bonded, e.g., a surface 110 of dielectric region 107 and a second surface 113 of a second element to be bonded thereto. The bonding layer may maintain the first and second elements in fixed positions. In a particular embodiment, the bonding layer 111 can be a B-stage, i.e., partially cured, dielectric material, just as dielectric region 105 can be a B-stage dielectric material. In an exemplary embodiment, dielectric region 107 and bonding layer 111 can both be made of the same B-stage dielectric material when applied to the structure.

As seen in FIG. 1A, one or more second electrically conductive elements 132 can contact and electrically connect respective electrically conductive elements 116, 106 which are exposed at the first surfaces 104, 114 of the first and second elements, respectively. The second electrically conductive element can extend at least partly along surfaces of the monolithic dielectric region, such as monolithic dielectric region 117, for example. As further seen in FIGS. 1A-B, the second conductive element 132 can entirely underlie the second surface 128 of the third element 122. The second conductive element 132 can be such that the thickness of at least a portion of the second conductive element, i.e., thickness 133 in a direction away from a surface of the dielectric layer 117 can be less than 10 micrometers (hereinafter, microns).

Figure 1B:
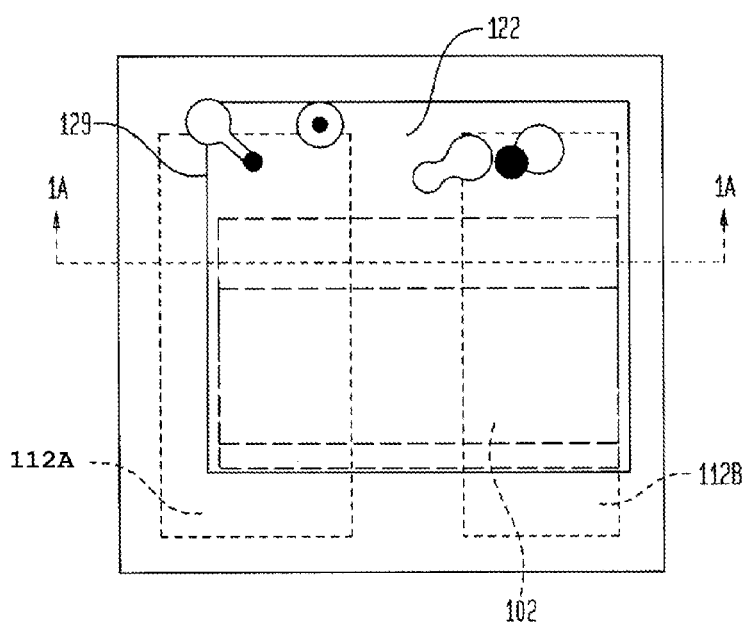
FIG. 1B is a top plan view corresponding to the sectional view of FIG. 1A, wherein the sectional view of FIG. 1A is taken through line 1A-1A of FIG. 1B.

In a particular embodiment, although not shown in FIGS. 1A-B, a second electric conductive element can contact and electrically connect the conductive elements 116, e.g., conductive pads, which are exposed at respective first surfaces 114 of two or more second elements.

In a particular embodiment, the first and second elements are microelectronic elements each of which embodies active circuit elements. The microelectronic assembly may further include a fourth element which embodies a plurality of passive circuit elements, e.g., transistors, diodes, etc.

An encapsulant region 134 may overlie the first surface 124 of the third element 122 and define an upper unit surface 136 which is disposed at a height 138 above the first surface 124 of the third element 122.

As further seen in FIG. 1A, a plurality of lower unit contacts 140 can be exposed at a lower unit surface 142 of the microelectronic assembly, which is a surface 142 remote from the upper unit surface 136. The lower unit surface 142 can be a surface of a support element 144 or carrier, e.g., a dielectric element such as a polymer tape, resin element, which may or may not be reinforced. In a particular embodiment, the dielectric element can be an epoxy-glass composite such as FR-4 (reinforced fiberglass), or BT resin, etc. One or more of the lower unit contacts 140 may overlie the second surface 103 of the first element.

Figure 2:
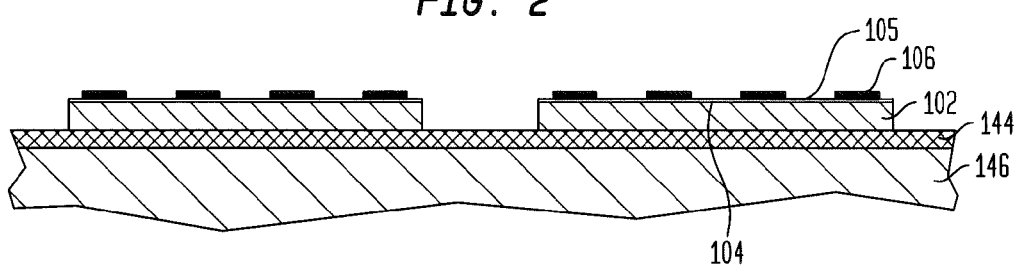
FIG. 2 is a sectional view illustrating a method of fabricating a microelectronic assembly in accordance with an embodiment herein.
Figure 3:
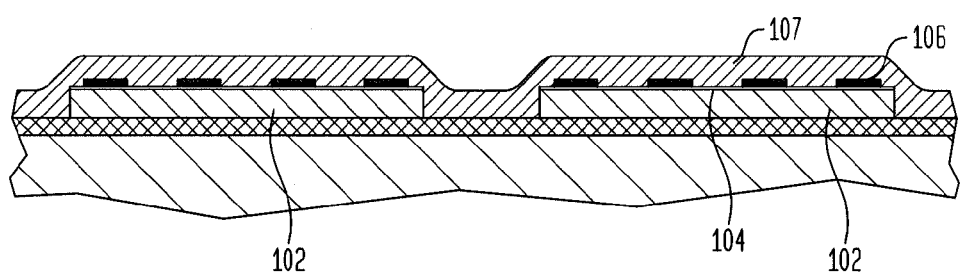
FIG. 3 is a sectional view illustrating a further stage in a method of fabricating a microelectronic assembly in accordance with an embodiment herein.

With reference to FIG. 2, a method of fabricating a microelectronic assembly according to an embodiment will now be described. As in FIG. 2, a plurality of substantially planar first elements 102 can be placed face up on a support element or carrier 144 such as that described above, such that conductive elements 106, e.g., pads, contacts or traces exposed at a dielectric layer 105 thereon, at first surface 104, face away from the support element 144. An additional temporary carrier element 146 may underlie carrier 144. Various ways are contemplated for forming the dielectric region 107, which may include one or more of depositing a liquid-phase material onto the first elements, e.g., by dispensing, spin-on, roller coating, screening or stenciling, etc. Alternatively, the dielectric region 107 can be formed by laminating a dielectric film thereon which may be fully or partially cured, e.g., a B-stage material prior to being laminated to the first elements 102 and support element 144. When the dielectric region 107 is a B-stage material, in one embodiment it may be possible to laminate the material to the first elements 102 without using an adhesive between the first elements 102 and the dielectric region 107. As seen in FIG. 3, this step produces a monolithic dielectric region 107 which overlies the first surfaces 104 and edge surfaces 109, 109A of the first elements 102.

Figure 4:
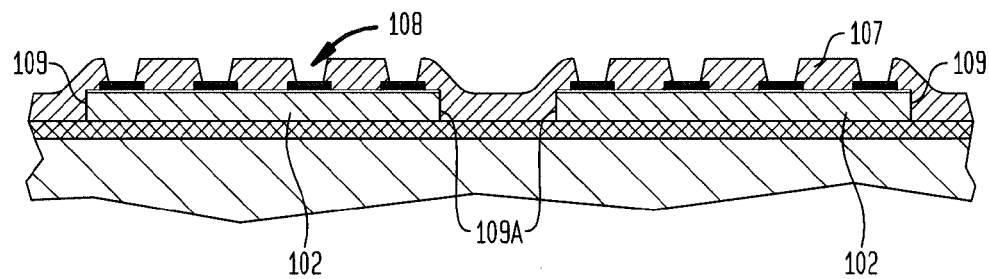
FIG. 4 is a sectional view illustrating a further stage in a method of fabricating a microelectronic assembly in accordance with an embodiment herein.

Then, as seen in FIG. 4, the dielectric region 107 can be patterned to form openings 108 therein which at least partly expose conductive elements 106. In an exemplary embodiment, patterning can be performed using a laser to ablate portions of the dielectric region covering the conductive elements. If the dielectric region 107 is a B-stage material, the B-stage material can undergo a curing process, e.g., with drying, heat or both, prior to being patterned.

Figure 5:
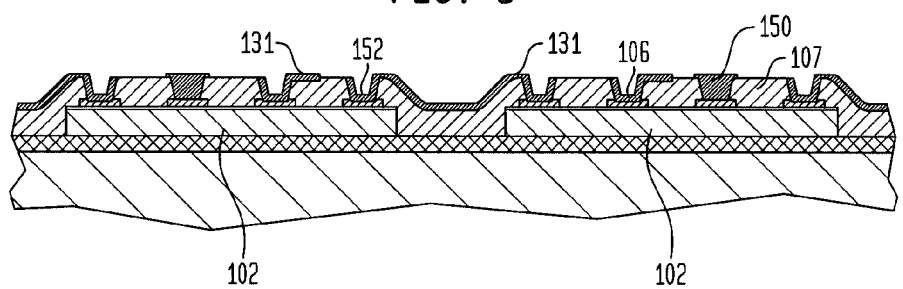
FIG. 5 is a sectional view illustrating a further stage in a method of fabricating a microelectronic assembly in accordance with an embodiment herein.

A step of forming second electrically conductive elements 131 (FIG. 5) can now be performed, which can include depositing a metal to contact the conductive elements 106, the metal extending along the dielectric region 107. In one example, this step can include forming a conductive seed layer on the dielectric region 107, e.g., by sputtering or electroless deposition. Then, a photoresist mask can be formed thereon and exposed photolithographically. The photoresist mask then can be used to pattern the seed layer, after which a thicker metal layer can be plated electrolytically onto the part of the seed layer which remains after the patterning step.

In one example, the conductive elements 131 can be formed using a process such as described in commonly owned U.S. application Ser. No. 12/842,669, the disclosure of which is incorporated herein by reference. In such process, a sacrificial layer can be provided overlying the dielectric layer which may conform to a contour of the underlying dielectric layer. The process can include forming a groove in at least the sacrificial layer, which may extend along a top surface of the dielectric layer and along at least one sloped surface within openings in the dielectric layer. The groove can extend along the at least the sloped surface or can merge with the opening in the dielectric layer. In one example, the groove can be formed by removing a portion of the sacrificial layer by a method that does not require casting an image upon a photo-imageable material layer using a fixed reticle or photomask. Thus, particular processes can include directing an illumination spot of a laser or a stream of particles towards the sacrificial layer and moving the spot or stream to form the groove.

Thereafter, a conductive element can be formed which has cross-sectional dimensions at least partly defined by the groove. In one example, a catalyst or seed layer can be deposited to overlie the sacrificial layer, after which the sacrificial layer can be removed so as to remove the catalyst or seed layer from areas other than within the groove. Thereafter, one or more plating processes can then be used to complete the conductive element by selectively plating a metal onto an exposed portion of a seed layer defined by the above-described processing.

The second conductive elements may fully or partially fill the patterned openings 108 (FIG. 4) in the dielectric layer 107 as seen at 150 (FIG. 5), or may extend along interior surfaces of the openings, conforming to contours of interior surfaces of such openings 108, as seen at 152. Some of the second conductive elements 131 may electrically connect a plurality of the first elements 102.

Figure 6:
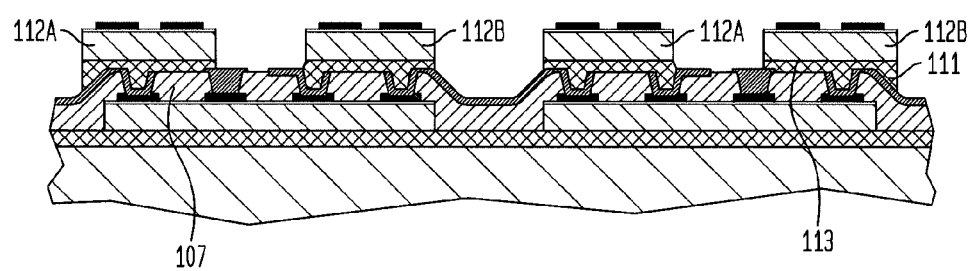
FIG. 6 is a sectional view illustrating a further stage in a method of fabricating a microelectronic assembly in accordance with an embodiment herein.

As seen in FIG. 6, the second, e.g., rear surfaces of a plurality of second elements 112A, 112B can be bonded to the underlying dielectric region 107, with a dielectric material 111 such as an adhesive. In a particular embodiment, the dielectric material can be a B-stage, i.e., partially cured, dielectric material which bonds the rear surfaces 113 of second elements 112A, 112B with the dielectric region 107 below.

Figure 7:
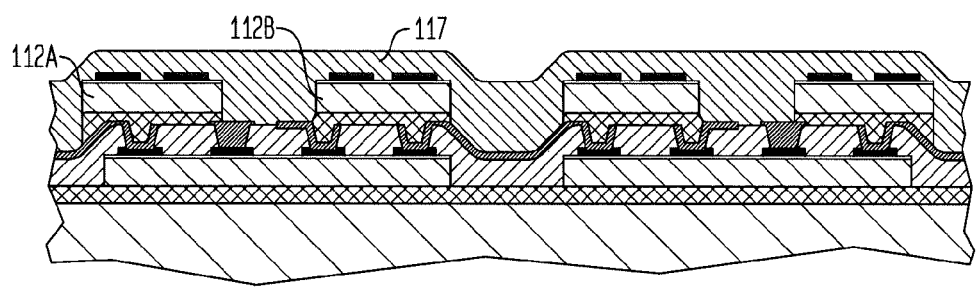
FIG. 7 is a sectional view illustrating a further stage in a method of fabricating a microelectronic assembly in accordance with an embodiment herein.
Figure 8:
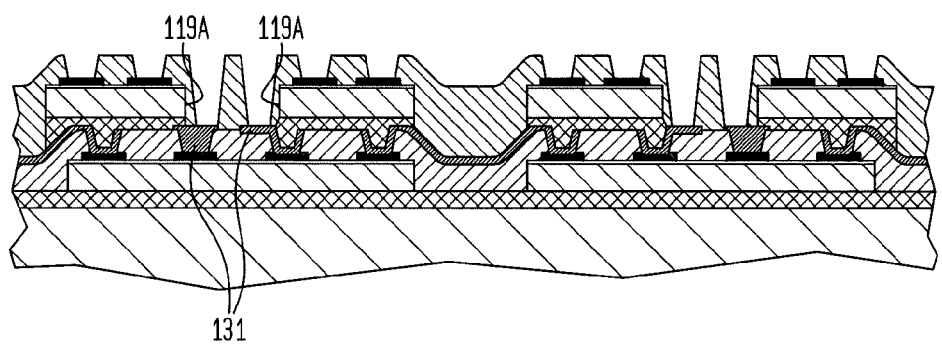
FIG. 8 is a sectional view illustrating a further stage in a method of fabricating a microelectronic assembly in accordance with an embodiment herein.

Next, as seen in FIG. 7, a second dielectric region 117 can be formed atop the second elements 112A, 112B, and patterned (FIG. 8), such as by the processing similar to that described above with respect to FIGS. 3 and 4, respectively. However, at locations between edges 119A between adjacent second elements, openings 118 can be formed in which one or more second conductive elements 131 of the assembly are exposed.

Figure 9:
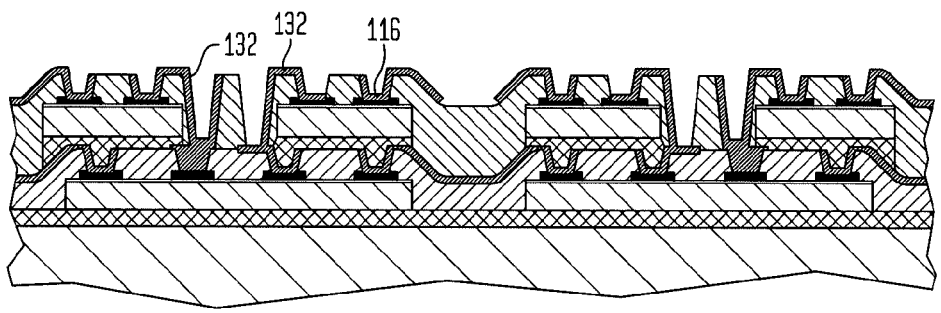
FIG. 9 is a sectional view illustrating a further stage in a method of fabricating a microelectronic assembly in accordance with an embodiment herein.

Then, additional electrically conductive elements 132 can be formed (FIG. 9) contacting conductive elements 116, such as by processing similar to that required to form conductive elements 131 as described above (FIG. 5). As seen in FIG. 9, the additional conductive elements 132, together with conductive elements 131, may electrically connect some conductive elements 106 of the first elements 102 with conductive elements 116 of the second elements.

Figure 10:
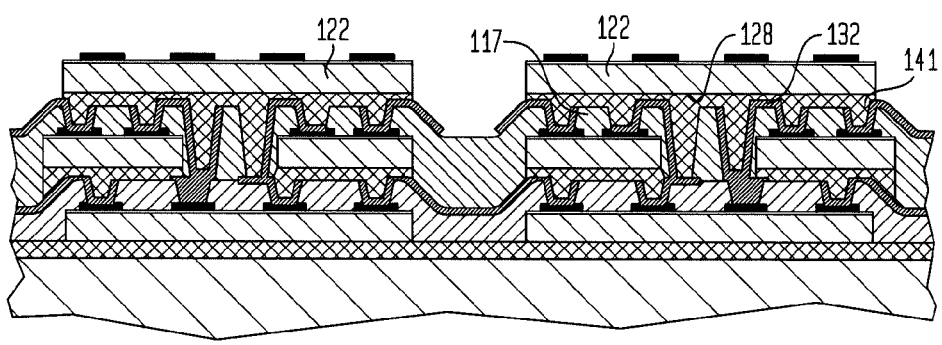
FIG. 10 is a sectional view illustrating a further stage in a method of fabricating a microelectronic assembly in accordance with an embodiment herein.

Next, as seen in FIG. 10, third elements can be bonded to the underlying structure, such as by one or more of the above-described techniques, e.g., bonding using an adhesive 141 or a B-stage dielectric material between the second surfaces 128 of the third elements 122 and the adjacent dielectric region 117 and conductive elements 132 thereon.

Figure 11:
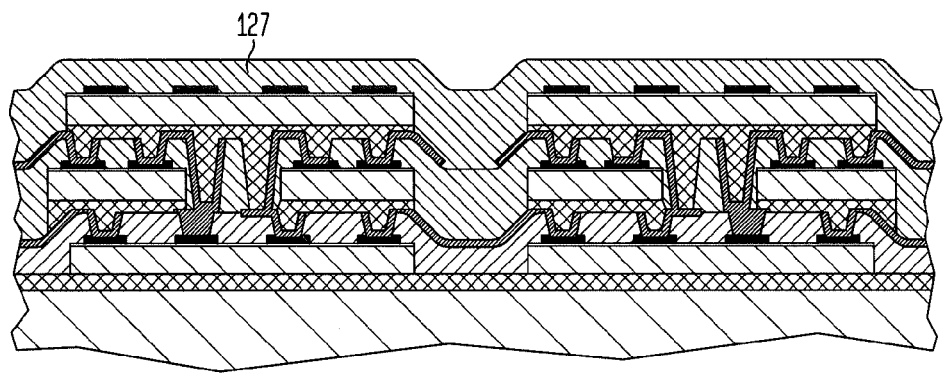
FIG. 11 is a sectional view illustrating a further stage in a method of fabricating a microelectronic assembly in accordance with an embodiment herein.
Figure 12:
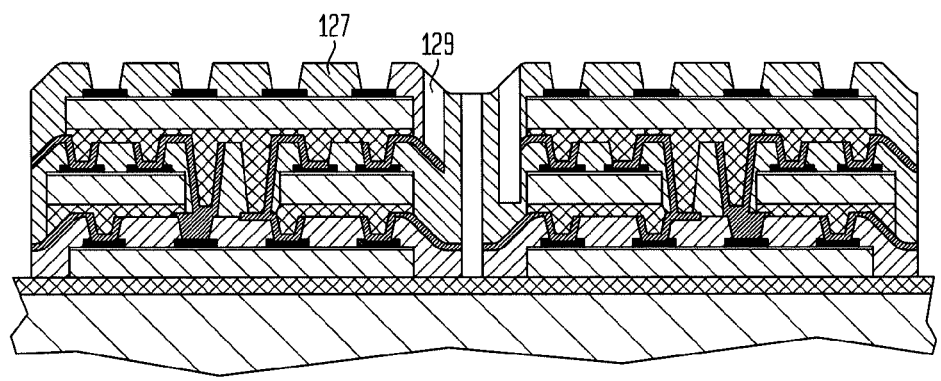
FIG. 12 is a sectional view illustrating a further stage in a method of fabricating a microelectronic assembly in accordance with an embodiment herein.
Figure 13:
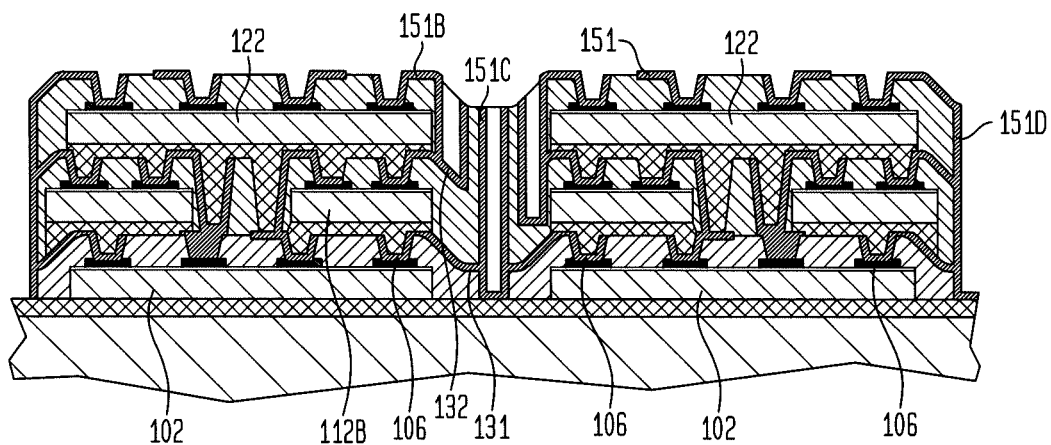
FIG. 13 is a sectional view illustrating a further stage in a method of fabricating a microelectronic assembly in accordance with an embodiment herein.

Further processing forms a third dielectric region 127 (FIG. 11) overlying the third elements 122. The dielectric region 127 can then be patterned (FIG. 12) to form openings 129 therein, such as, for example, by laser ablation, among others, as described above. Third electrically conductive elements 151 then can be formed (FIG. 13) within the openings 129, the conductive elements 151 contacting conductive elements 126, e.g., pads, contacts or traces, of the third elements 122. As seen in FIG. 13, some (151B) of the third conductive elements can be electrically connected with the second conductive elements 132 so as to electrically connect conductive elements 116, 126 on the second and third elements 112, 122, respectively. Others of the third conductive elements (151C) can electrically connect conductive elements 131 of adjacent first elements so as to electrically connect conductive elements 106 on the first elements at a first level of the assembly. In another example, a single conductive element selected from conductive elements 151B, 151C, and 151D depicted in FIG. 13 may electrically connect two or more substantially planar elements, e.g., two or more of any of elements 102, 112, or 122 at one level of the assembly, any of two different levels, or between any of the different levels of the microelectronic assembly. In a particular example, such conductive element may provide an electrical connection between a first element 102 and a third element 122, which may or may not also be electrically connected with the second element 112.

Figure 14:
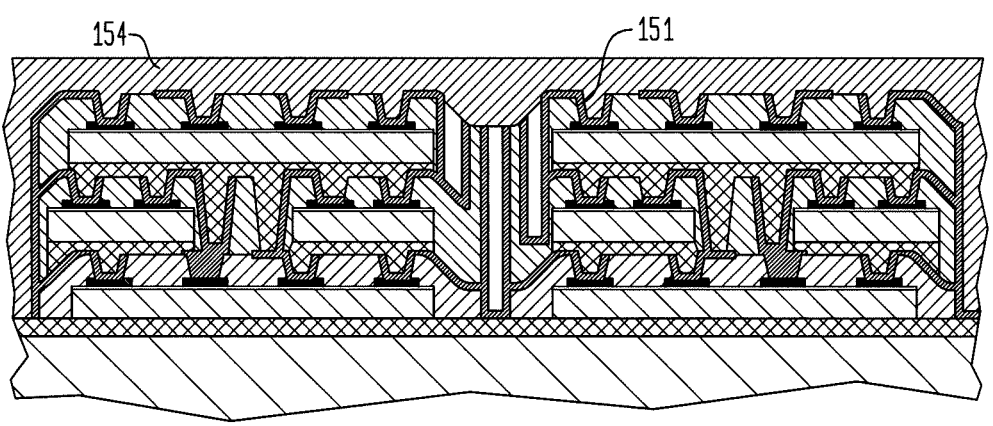
FIG. 14 is a sectional view illustrating a further stage in a method of fabricating a microelectronic assembly in accordance with an embodiment herein.

As shown in FIG. 14, a fourth dielectric region 154, which can be an encapsulant, can then be formed overlying the third elements 122, third dielectric region 127 and third conductive elements 151. In one embodiment, the dielectric region can be molded onto the in-process structure, as by inserting the structure between mold plates (not shown) and injecting an encapsulant into the volume defined by the mold plates. In one example, the encapsulant region can be a solder mask.

Figure 15:
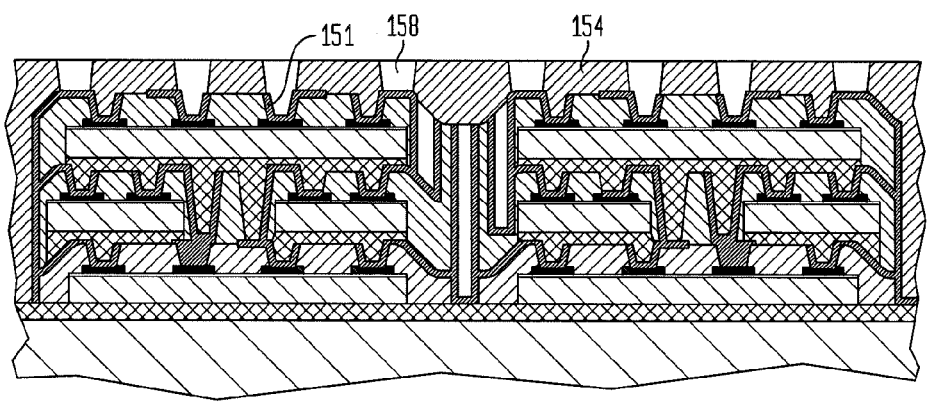
FIG. 15 is a sectional view illustrating a further stage in a method of fabricating a microelectronic assembly in accordance with an embodiment herein.

FIG. 15 illustrates a further stage in which openings 158 can be formed in the fourth dielectric region 154, in which the third conductive elements 151 can be exposed.

Figure 16:
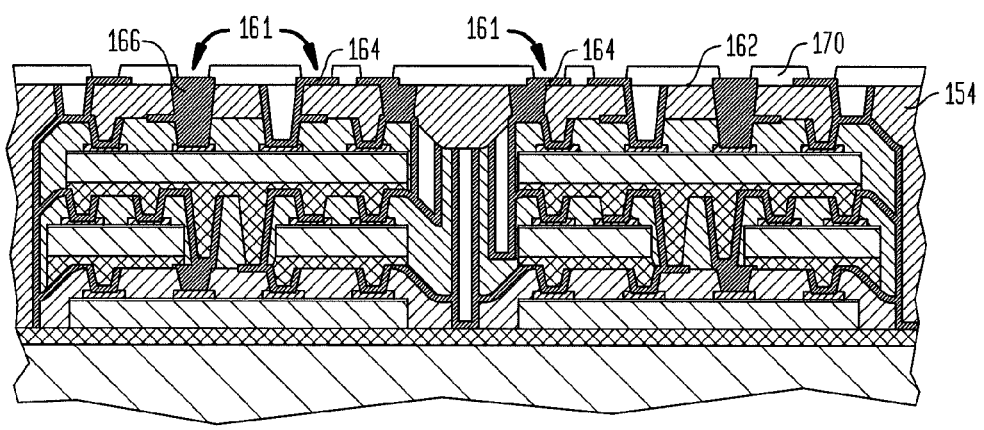
FIG. 16 is a sectional view illustrating a further stage in a method of fabricating a microelectronic assembly in accordance with an embodiment herein.

Thereafter, as seen in FIG. 16, further, fourth conductive elements 161 can be formed which contact the third conductive elements 151 and extend to heights at or adjacent to a plane defined by a surface 162 of the dielectric region 154, e.g., the encapsulant region. In one example, as seen in FIG. 16, the fourth conductive elements include electrically conductive pads 164 exposed at or overlying the surface 162 of the dielectric region. However, as seen at 166, the fourth conductive elements may simply fill or partially fill the openings in at least the dielectric region 154. In one example, encapsulant region may further include a solder mask 170 overlying layer 154, and the fourth conductive elements can function as upper unit contacts exposed within openings in the solder mask 170.

Referring again to FIGS. 1A-B, in an exemplary embodiment, the temporary carrier 146 can be removed, and the structure depicted in FIG. 16 can be severed along the periphery of individual first elements, for example. Optionally, to form conductive contacts, e.g., pads at a lower unit surface of the microelectronic assembly 100 (FIGS. 1A-B) further patterning and metal deposition, or both can be used to form fifth conductive elements 140 at the lower unit surface 142 which are available at the lower unit surface for electrically interconnecting the microelectronic assembly 100 with an external element, such as a circuit panel, passive component, or other electrical component.

The structures discussed above provide extraordinary three-dimensional interconnection capabilities. These capabilities can be used with chips of any type. Merely by way of example, the following combinations of chips can be included in structures as discussed above: (i) a processor and memory used with the processor; (ii) plural memory chips of the same type; (iii) plural memory chips of diverse types, such as DRAM and SRAM; (iv) an image sensor and an image processor used to process the image from the sensor; (v) an application-specific integrated circuit ("ASIC") and memory.

Figure 17:
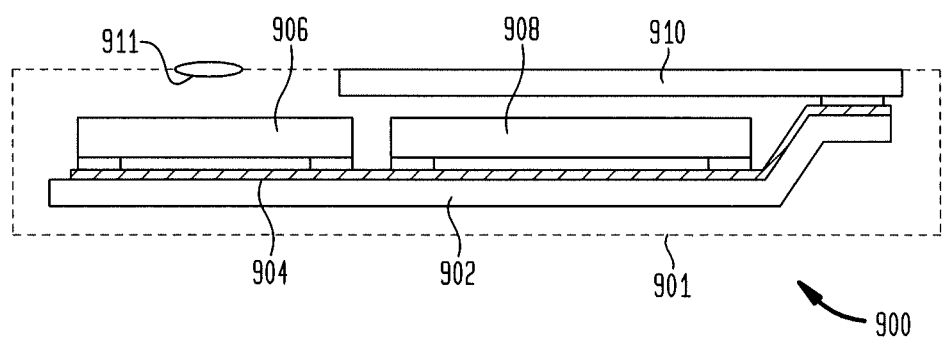
FIG. 17 is a sectional view schematically illustrating a system in accordance with an embodiment of the invention.

The structures discussed above can be utilized in construction of diverse electronic systems. For example, a system 900 (FIG. 17) in accordance with a further embodiment of the invention includes a structure 906 as described above in conjunction with other electronic components 908 and 910. In the example depicted, component 908 is a semiconductor chip whereas component 910 is a display screen, but any other components can be used. Of course, although only two additional components are depicted in FIG. 26 for clarity of illustration, the system may include any number of such components. The structure 906 as described above may be, for example, a microelectronic assembly 100 as discussed above in connection with FIGS. 1A-B. In a further variant, both may be provided, and any number of such structures may be used. Structure 906 and components 908 and 910 are mounted in a common housing 901, schematically depicted in broken lines, and are electrically interconnected with one another as necessary to form the desired circuit. In the exemplary system shown, the system includes a circuit panel 902 such as a flexible printed circuit board, and the circuit panel includes numerous conductors 904, of which only one is depicted in FIG. 17, interconnecting the components with one another. However, this is merely exemplary; any suitable structure for making electrical connections can be used. The housing 901 is depicted as a portable housing of the type usable, for example, in a cellular telephone or personal digital assistant, and screen 910 is exposed at the surface of the housing. Where structure 906 includes a light-sensitive element such as an imaging chip, a lens 911 or other optical device also may be provided for routing light to the structure. Again, the simplified system shown in FIG. 17 is merely exemplary; other systems, including systems commonly regarded as fixed structures, such as desktop computers, routers and the like can be made using the structures discussed above.

As these and other variations and combinations of the features discussed above can be utilized without departing from the present invention, the foregoing description of the preferred embodiments should be taken by way of illustration rather than by way of limitation of the invention.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A microelectronic assembly, comprising:
first and second substantially planar elements, each having a first surface and an edge surface extending away from the respective first surface, each of the first and second elements having a dielectric layer exposed at the first surface and a plurality of first conductive elements exposed at the first surface, at least one of the first or second elements being a microelectronic element embodying a plurality of active circuit elements, wherein the second element at least partly overlies the first surface of the first element, with the first surface of the second element facing away from the first element;
a single monolithic dielectric region contacting the first surface and at least one edge surface of at least one of the first and second elements, at least one of the first conductive elements exposed within an opening of the monolithic dielectric region, the monolithic dielectric region having a surface above the first surface of the at least one of the first or second elements; and at least one second electrically conductive element overlying and extending along a surface of the monolithic dielectric region at locations remote from the first edge surface and along the at least one edge surface of the at least one first or second element, at least a portion of the second electrically conductive element having a thickness of less than 10 microns and extending from the at least one first conductive element to a location beyond the at least one edge surface; and a dielectric bonding layer contacting the surface of the monolithic dielectric region and overlying the second electrically conductive element, wherein a third element is bonded to the monolithic dielectric region on the second element through the dielectric bonding layer.

2. A microelectronic assembly as claimed in claim 1, further comprising a third substantially planar element at least partly overlying the first surface of the second element.

3. A system comprising a structure according to claim 1 and one or more other electronic components electrically connected to the structure.

4. A system as claimed in claim 3 further comprising a housing, said structure and said other electronic components being mounted to said housing.

5. The microelectronic assembly as claimed in claim 1, wherein the second electrically conductive element is formed by depositing a metal onto the first conductive elements of the first and second elements and onto the monolithic dielectric region overlying the first and second elements.

* * * * *